United States Patent
Zhang et al.

(10) Patent No.: US 10,636,895 B2
(45) Date of Patent: Apr. 28, 2020

(54) VERTICAL TRANSPORT FIELD EFFECT TRANSISTOR ON SILICON WITH DEFINED JUNCTIONS

(71) Applicant: International Business Machines Corporation, Armonk, NY (US)

(72) Inventors: Chen Zhang, Guilderland, NY (US); Kangguo Cheng, Schenectady, NY (US); Xin Miao, Slingerlands, NY (US); Wenyu Xu, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/423,413

(22) Filed: May 28, 2019

(65) Prior Publication Data

US 2019/0355834 A1    Nov. 21, 2019

Related U.S. Application Data

(63) Continuation of application No. 15/984,567, filed on May 21, 2018, now Pat. No. 10,424,653.

(51) Int. Cl.
*H01L 29/66* (2006.01)
*H01L 29/78* (2006.01)
(Continued)

(52) U.S. Cl.
CPC .. *H01L 29/66666* (2013.01); *H01L 21/02381* (2013.01); *H01L 21/02538* (2013.01);
(Continued)

(58) Field of Classification Search
CPC ......... H01L 29/66666; H01L 21/02381; H01L 21/02538; H01L 21/31144; H01L 29/7827; H01L 21/823885; H01L 29/78642
See application file for complete search history.

(56) References Cited

U.S. PATENT DOCUMENTS 8,173,551 B2    5/2012   Bai et al.
9,318,583 B2    4/2016   Verhulst et al.
(Continued)

OTHER PUBLICATIONS

T. Orzali et al., "GaAs on Si Epitaxy by Aspect Ratio Trapping: Analysis and Reduction of Defects Propagating Along the Trench Direction," Journal of Applied Physics (AIP), Sep. 2015, pp. 1-9, vol. 118, No. 10.
(Continued)

*Primary Examiner* — Feifei Yeung Lopez
(74) *Attorney, Agent, or Firm* — L. Jeffrey Kelly; Ryan, Mason & Lewis, LLP

(57) ABSTRACT

A method for fabricating a semiconductor structure includes the following steps. A plurality of dielectric layers is formed on a substrate, wherein the material composition and layer positioning of each of the plurality of dielectric layers are selected to enable defined junctions for one or more features of the semiconductor structure. A trench is formed through each of the plurality of dielectric layers to the top of the substrate, wherein the height and width dimensions of the trench are selected in accordance with an aspect ratio trapping process. A vertical fin structure is formed by epitaxially growing material within the trench on the top of the substrate. In further steps, gate stack and source/drain regions are formed around the vertical fin structure in accordance with the positioning of the plurality of dielectric layers. The resulting semiconductor structure, in one or more examples, is a vertical transport field-effect transistor.

20 Claims, 18 Drawing Sheets

(51) Int. Cl.
  *H01L 21/762* (2006.01)
  *H01L 21/02* (2006.01)
  *H01L 21/311* (2006.01)
  *H01L 21/8238* (2006.01)
  *H01L 29/786* (2006.01)

(52) U.S. Cl.
  CPC .. *H01L 21/31144* (2013.01); *H01L 21/76224* (2013.01); *H01L 21/823885* (2013.01); *H01L 29/7827* (2013.01); *H01L 29/78642* (2013.01)

(56) References Cited

U.S. PATENT DOCUMENTS

| | | | |
|---|---|---|---|
| 9,349,809 | B1 | 5/2016 | Cheng et al. |
| 9,680,473 | B1 | 6/2017 | Anderson et al. |
| 10,424,653 | B1 * | 9/2019 | Zhang ............... H01L 21/02538 |
| 2001/0042867 | A1 | 11/2001 | Furuhata |
| 2014/0030859 | A1 * | 1/2014 | Xie ................. H01L 21/823814 438/199 |
| 2016/0233343 | A1 * | 8/2016 | Miyairi ............... H01L 29/4236 |
| 2017/0345933 | A1 | 11/2017 | Fung |
| 2017/0365674 | A1 | 12/2017 | Lee et al. |

OTHER PUBLICATIONS

List of IBM Patents or Patent Applications Treated as Related.

* cited by examiner

100

100

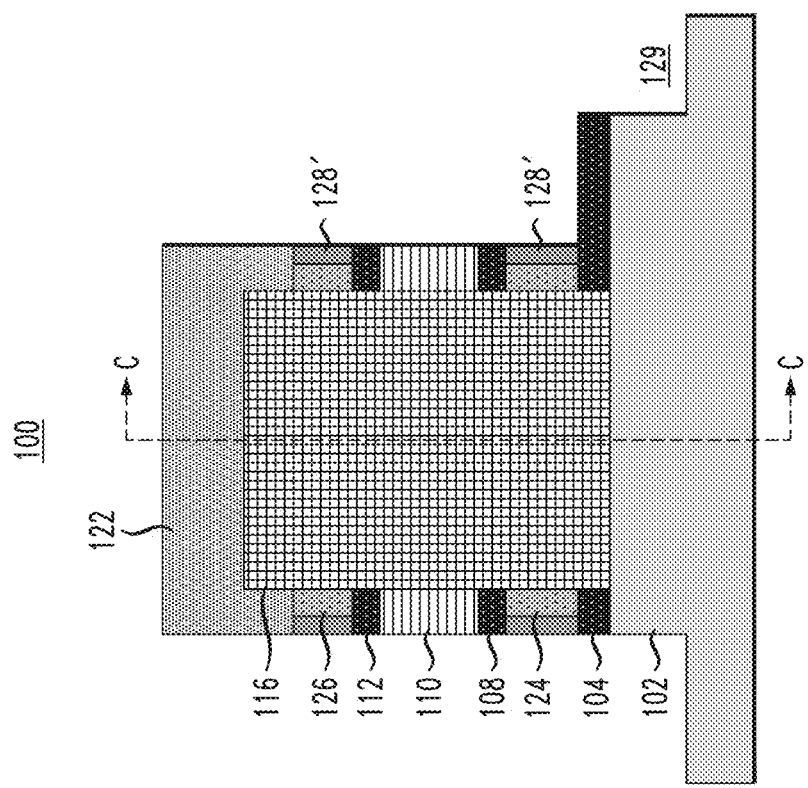
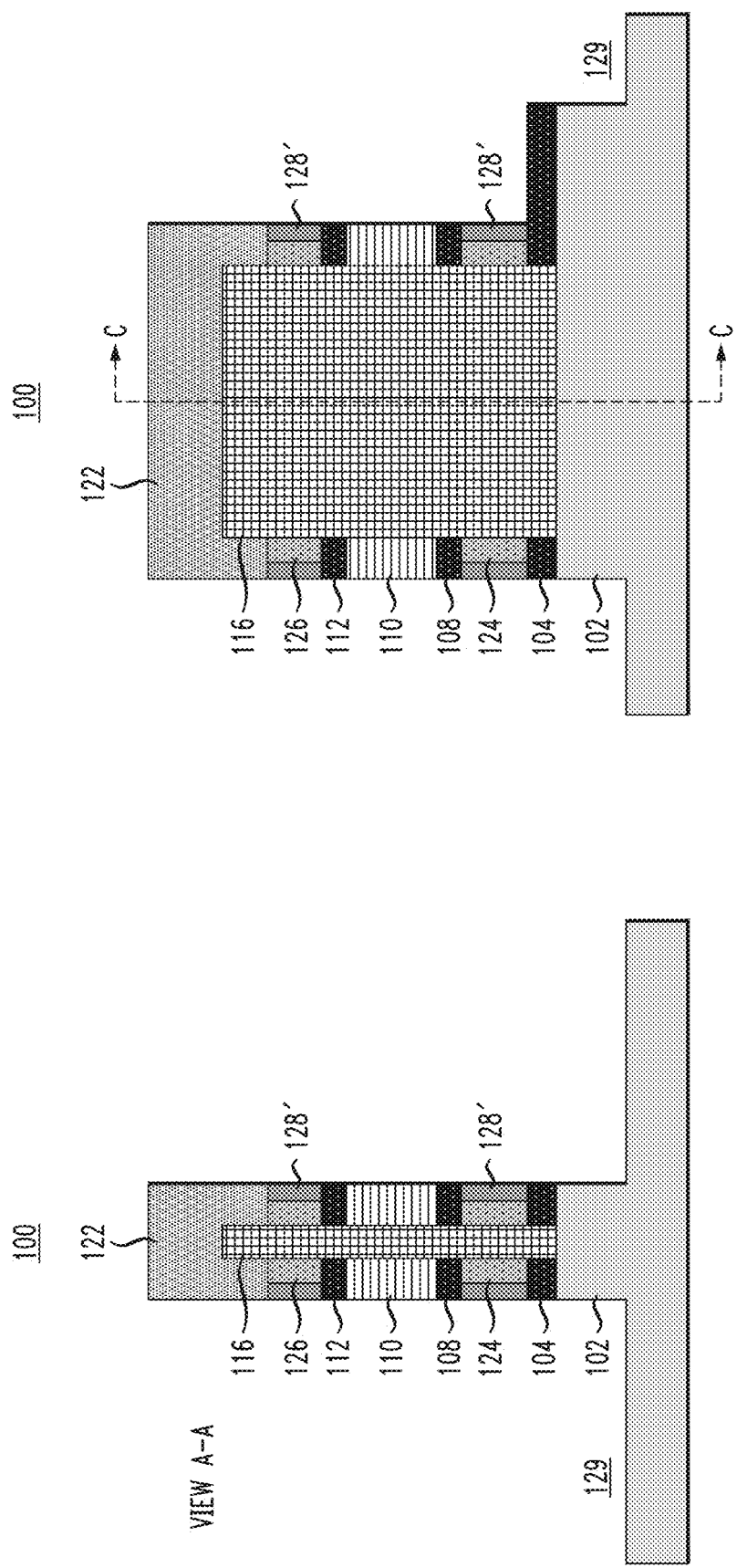

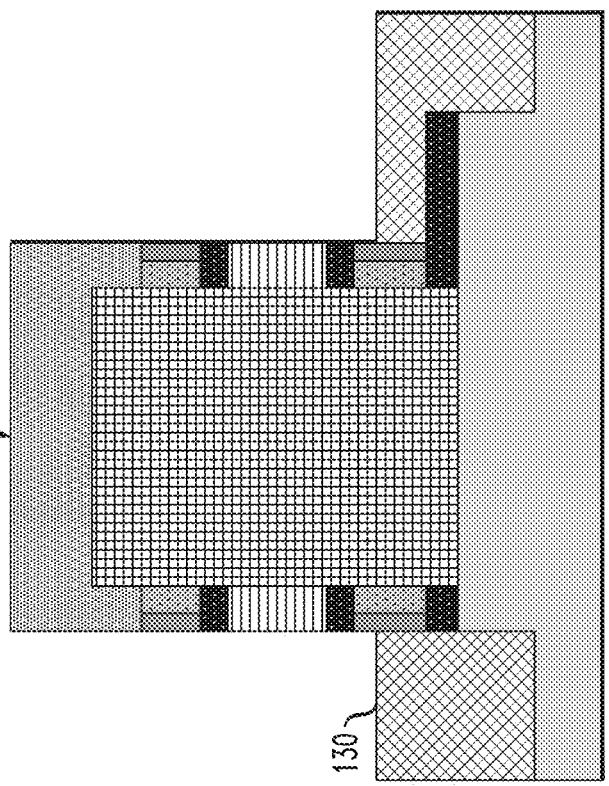
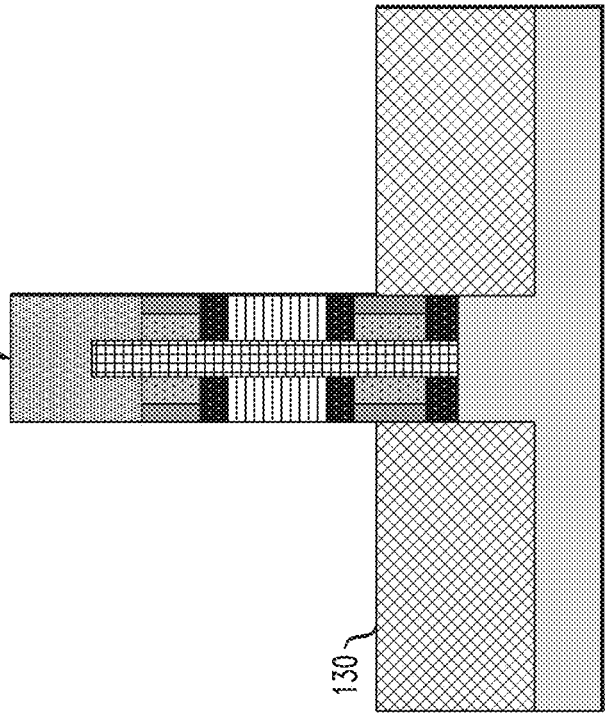
FIG. 15A
FIG. 15B

100

100

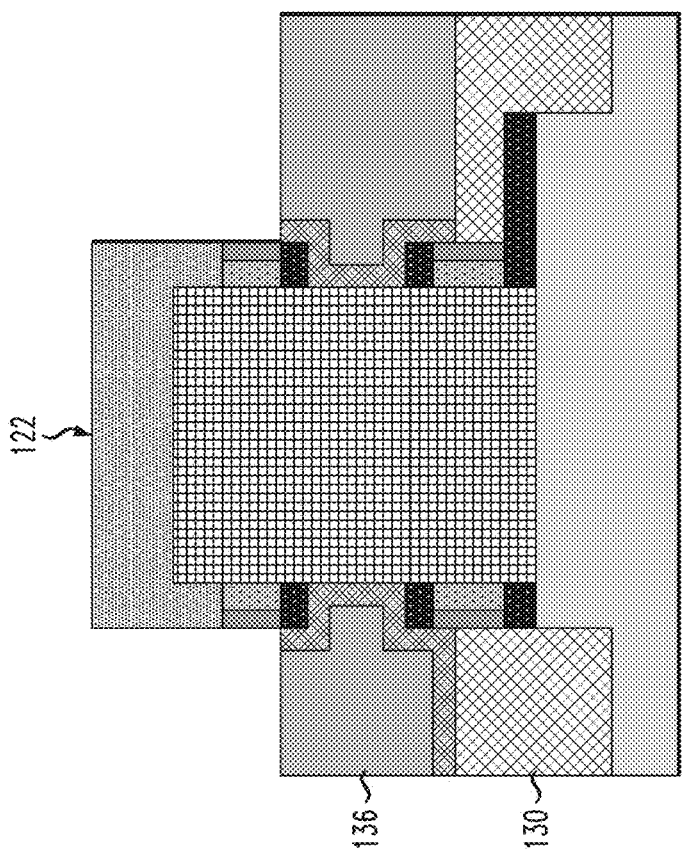
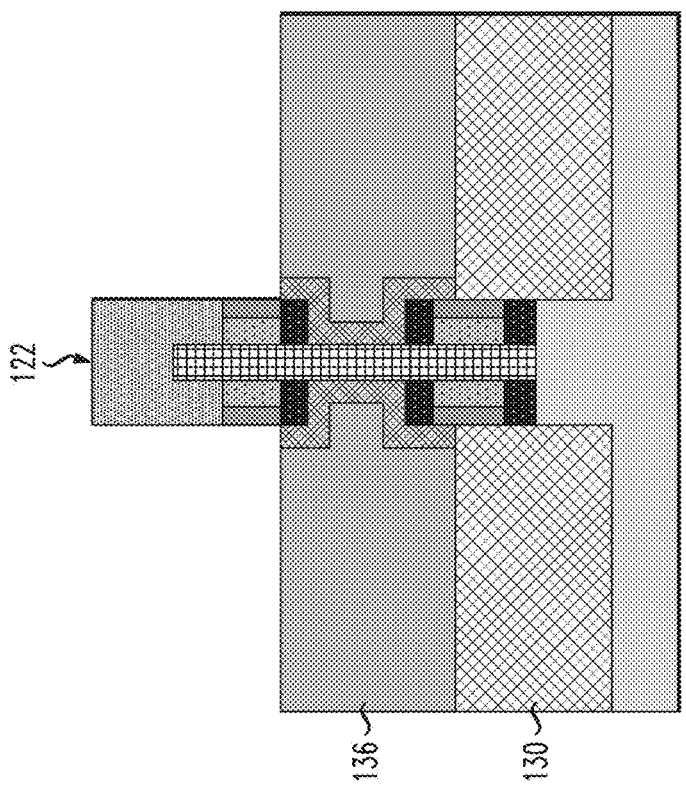

100

100

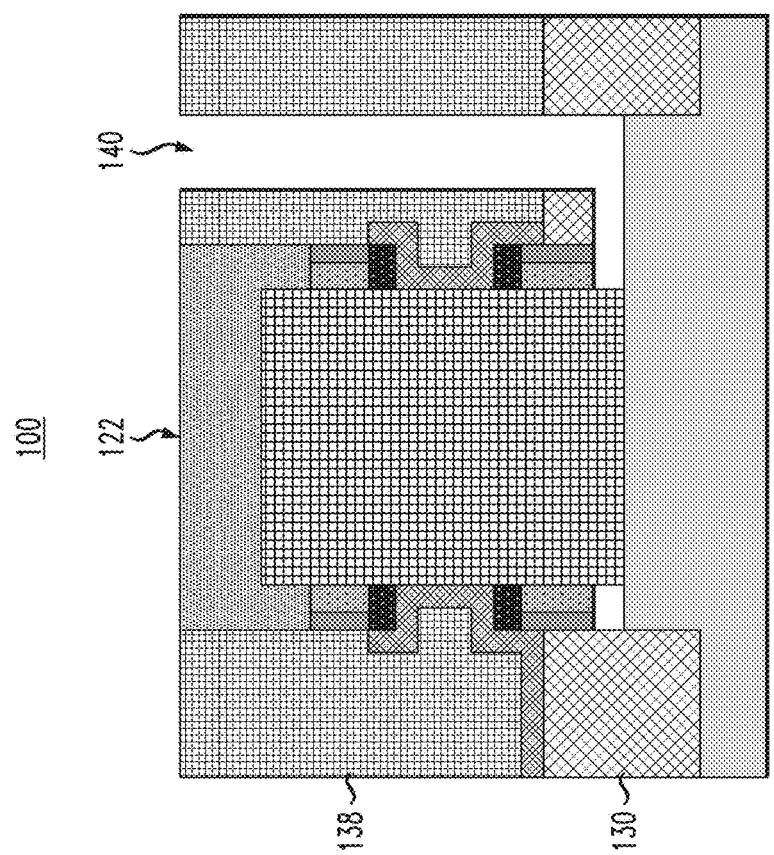
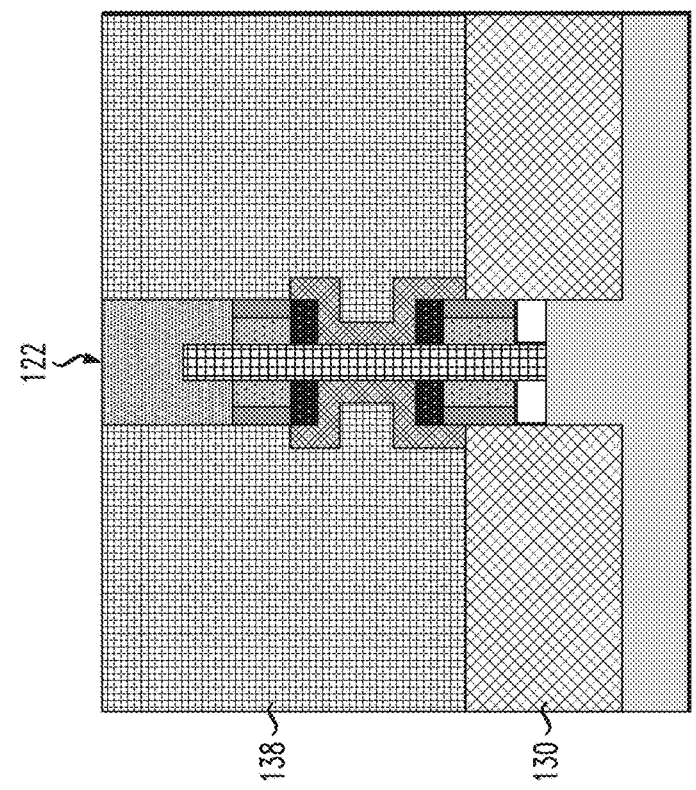

200

200

VERTICAL TRANSPORT FIELD EFFECT TRANSISTOR ON SILICON WITH DEFINED JUNCTIONS

FIELD

The present application relates to semiconductors and, more particularly, to techniques for forming semiconductor structures.

BACKGROUND

Semiconductors and integrated circuits (IC or chips) have become ubiquitous within many products, particularly as they continue to decrease in cost and size. There is a continuous desire to reduce the size of structural features and/or to provide a greater number of structural features for a given chip size. Miniaturization, in general, allows for increased performance at lower power levels and lower cost. Present technology is at or approaching atomic level scaling of certain devices such as field-effect transistors.

A field-effect transistor (FET) is a transistor having a source, a gate, and a drain, and operates based on the flow of carriers (electrons or holes) along a channel that runs between the source and drain. Current through the channel between the source and drain is controlled by a transverse electric field applied at the gate.

FETs are widely used for switching, amplifying, filtering, and other tasks. FETs include metal-oxide-semiconductor (MOS) FETs (MOSFETs). Complementary MOS (CMOS) devices are widely used, where both n-type and p-type transistors (NFET and PFET) are used to fabricate logic and other circuitry in IC devices. Source and drain regions of a conventional lateral FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in IC devices requires development of new structural and design features, including shrinking gate lengths and other reductions in size or scaling of devices. Continued scaling, however, is reaching limits of conventional fabrication techniques.

Vertical transport FETS (VTFETs) have become a promising alternative to the conventional lateral FET structures due to potential benefits including, among others, reduced circuit footprint. In a VTFET structure, the current flow is perpendicular to the supporting wafer (substrate) as compared with parallel current flow in a conventional lateral FET structure. As such, VTFETs can provide devices with improved circuit density. However, challenges exist in terms of layout-level implications when using VTFETs in ICs.

SUMMARY

Embodiments of the invention provide techniques for forming improved semiconductor structures, for example, vertical transport field effect transistors on silicon with defined junctions.

For example, in one embodiment, a method for fabricating a semiconductor structure comprises the following steps. A plurality of dielectric layers is formed on a substrate, wherein the material composition and layer positioning of each of the plurality of dielectric layers are selected to enable defined junctions for one or more features of the semiconductor structure. A trench is formed through each of the plurality of dielectric layers to the top of the substrate, wherein the height and width dimensions of the trench are selected in accordance with an aspect ratio trapping process. A vertical fin structure is formed by epitaxially growing material within the trench on the top of the substrate. In further embodiments, gate stack and source/drain regions are formed around the vertical fin structure in accordance with the positioning of the plurality of dielectric layers.

Advantageously, illustrative embodiments of the invention provide fabrication methods for using aspect ratio trapping techniques to grow vertical fins on silicon and forming a VTFET structure with defined junction positions. For example, one or more illustrative embodiments provide techniques for forming one or more narrow vertical III-V semiconductor fins on a silicon substrate. Defined junctions are achieved by depositing multiple dielectric layers which are used to determine the positions of the upper and lower source/drains, the gate, other dielectrics and metal contacts in the VTFET structure. However, it is to be appreciated that techniques described herein can be implemented in alternative embodiments with one or more narrow vertical silicon fins formed on a silicon substrate.

These and other features, objects and advantages of the present invention will become apparent from the following detailed description of illustrative embodiments thereof, which is to be read in connection with the accompanying drawings.

BRIEF DESCRIPTION OF THE DRAWINGS

FIGS. 14A and 14B depict respective width and length cross-sectional views of the semiconductor structure of FIG. 13 following self-aligned directional etching to form a shallow trench, according to an embodiment of the invention.

FIGS. 15A and 15B depict respective width and length cross-sectional views of the semiconductor structure of FIGS. 14A and 14B following shallow isolation trench oxide fill, planarization and etching, according to an embodiment of the invention.

FIGS. 19A and 19B depict respective width and length cross-sectional views of the semiconductor structure of FIGS. 18A and 18B following exposed gate stack removal, according to an embodiment of the invention.

FIGS. 22A and 22B depict respective width and length cross-sectional views of the semiconductor structure of FIGS. 21A and 21B following selective removal of bottom dielectric material, according to an embodiment of the invention.

DETAILED DESCRIPTION

Figure 1:
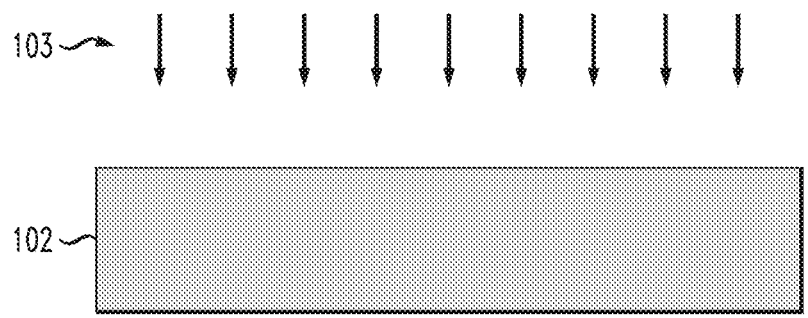
FIG. 1 depicts a side cross-sectional view of a semiconductor structure following well implantation in a silicon substrate, according to an embodiment of the invention.

Illustrative embodiments of the invention will be described herein with reference to particular methods and apparatus. It is to be appreciated, however, that the invention is not limited to the specific methods and apparatus illustratively shown and described herein. Rather, embodiments of the invention are directed more broadly to techniques for forming field effect transistors on silicon with defined junctions. Moreover, it will become apparent to those skilled in the art given the teachings herein that numerous modifications can be made to the embodiments shown that are within the scope of the present invention. That is, no limitations with respect to the specific embodiments described herein are intended or should be inferred.

As mentioned above, a VTFET provides a reduced circuit footprint in comparison to a conventional lateral FET structure and thus is suitable for use in a variety of contexts, including but not limited to, computing devices, mobile devices, servers, etc. However, growing non-silicon semiconductors, such as group III-V semiconductors (e.g., gallium arsenic (GaAs), indium phosphorus (InP), gallium phosphorus (GaP), gallium nitride (GaN)), for use in VTFETs may suffer from issues arising from lattice mismatch, a problem that arises when layering and combining various semiconductor materials. Different semiconductor materials used for forming the semiconductor structure may have varying lattice constants. Lattice mismatch occurs where two materials featuring different lattice constants are brought together by growth or deposition of one material on top of another (also referred to as a "heterostructure"). Thus, when growing a semiconductor material with one lattice constant on a semiconductor material with another lattice constant, dislocation defects may occur which may render the semiconductor device unusable if the dislocation defects are severe.

Various embodiments described herein use techniques for addressing and overcoming one or more of the issues arising from lattice mismatch. In illustrative embodiments, an aspect ratio trapping (ART) technique is utilized for addressing and overcoming one or more of the issues arising from lattice mismatch. In ART, a trench is formed with a certain aspect ratio (e.g., the ratio of the trench height or depth to trench width, i.e., h/w) such that dislocation defects terminate on the sidewall of the trench and any layer above the termination is defect free. While the specific aspect ratio depends on the feature being formed, generally the feature length or depth is much larger than the feature width thus resulting in a high aspect ratio. Examples of suitable aspect ratios will be specified below for illustrative embodiments of fin structures.

Accordingly, illustrative embodiments use ART techniques to epitaxially grow one or more vertical non-silicon fins (e.g., group III-IV semiconductor materials) on a silicon (Si) substrate and then form a VTFET structures from the one or more fins with defined junction positions. As will be illustrated, defined junctions are achieved by depositing multiple dielectric layers which are used to determine the positions of the upper and lower source/drains, the gate, other dielectrics and metal contacts in the VTFET structure.

As illustratively used herein, terms such as "epitaxial growth and/or epitaxial deposition" and "epitaxially formed and/or epitaxially grown" refer to the growth of a semiconductor material on a deposition surface of a semiconductor material.

In one case, the semiconductor material being epitaxially grown (e.g., group III-IV semiconductor material) has different crystalline characteristics as the semiconductor material (e.g., Si) of the deposition surface. For example, there is a large lattice constant mismatch between group III-IV semiconductors (e.g., about 5.6 to 6.4 Angstroms) and silicon (e.g., about 5.4 Angstroms). In a typical epitaxial deposition process, the chemical reactants provided by source gases are controlled, and system parameters are set, so that the depositing atoms arrive at the deposition surface of the semiconductor substrate with sufficient energy to move around on the surface and orient themselves to the crystal arrangement of the atoms of the deposition surface.

In another case, the semiconductor material being epitaxially grown may have the same or substantially similar crystalline characteristics as the semiconductor material of the deposition surface. This is the case when the source/drain regions are epitaxially grown, as will be further explained below.

In some embodiments, epitaxial growth and/or epitaxial deposition processes are selective to forming on a semiconductor surface, and do not deposit material on dielectric surfaces such as, by way of example, silicon dioxide or silicon nitride surfaces.

Examples of various epitaxial growth processes include, but are not limited to, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from about 550° C. to about 900° C. Although higher temperature typically results in faster deposition, the faster deposition may result in crystal defects and film cracking.

As illustratively used herein, "deposition" refers to one of a variety of conventional techniques known to those of ordinary skill in the art. For example, deposition techniques may include, but are not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), sputtering, and/or plating.

An illustrative embodiment for forming a semiconductor structure comprising a VTFET will be described below with reference to FIGS. 1 though 24B. More particularly, FIGS. 1 through 13 depict the formation of fin structure 100. FIGS. 14A through 24B then depict the use of fin structure 100 to form a VTFET device. FIGS. 24A and 24B illustrate a resulting single VTFET device 200. However, it is to be understood that a plurality of such VTFET devices can be formed in the same manner as illustrated in FIGS. 1-24B. Furthermore, while FIGS. 1-24B represent semiconductor structures and devices, the figures also represent steps in the process of forming such semiconductor structures and devices.

FIG. 1 depicts a side cross-sectional view of an initial stage of the formation of semiconductor structure 100 including a silicon (Si) substrate 102 with a well implantation operation 103 being depicted by the directional arrows.

As is known, well implantation or ion implantation typically involves an ion source where ions of a given element are obtained, an accelerator where the ions are electrostatically accelerated to a high energy, and a target chamber where the ions impinge on a target (i.e., which is the material into which the desired element is to be implanted). More particularly, in semiconductor fabrication, well or ion implantation comprises distribution of impurities using dopant ions to form n-type or p-type well regions as required in the target silicon substrate (e.g., 102 in FIG. 1). One of ordinary skill in the art will realize methods and dopant concentrations for forming well regions in the substrate for proper operation of the VTFET formed thereon.

By way of example only, Si substrate 102 may have a vertical thickness of about 200 micrometers ($\mu m$) to about 500 $\mu m$.

Figure 2:
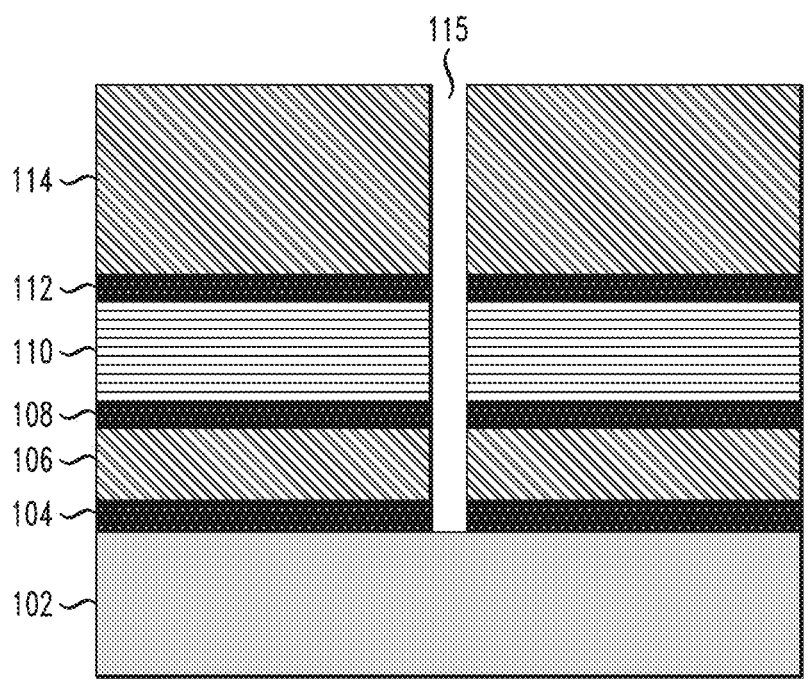
FIG. 2 depicts a side cross-sectional view of the semiconductor structure of FIG. 1 following multilayer dielectric deposit and vertical trench formation, according to an embodiment of the invention.

FIG. 2 depicts a side cross-sectional view of the semiconductor structure of FIG. 1 following multilayer dielectric deposit and then vertical trench formation, according to an embodiment of the invention.

Thus, as shown in FIG. 2, multiple layers of dielectric material 104, 106, 108, 110, 112, 114 are sequentially deposited on the semiconductor substrate 102 in the formation of semiconductor structure 100, i.e., dielectric layer 104 is deposited on substrate 102, dielectric layer 106 is deposited on dielectric layer 104, dielectric layer 108 is deposited on dielectric layer 106, dielectric layer 110 is deposited on dielectric layer 108, dielectric layer 112 is deposited on dielectric layer 110, and dielectric layer 114 is deposited on dielectric layer 112. The multiple layers comprise a plurality of different dielectric materials. For example, as shown in FIG. 2, dielectric layers 104, 108 and 112 comprise silicon nitride (SiN), dielectric layers 106 and 114 comprise silicon dioxide ($SiO_2$), and dielectric layer 110 comprises carbon doped silicon oxide (SiCO).

By way of example only, dielectric layer 104 may have a vertical thickness of about 10 nanometers (nm) to about 20 nm; dielectric layer 106 may have a vertical thickness of about 15 nm to about 30 nm; dielectric layer 108 may have a vertical thickness of about 5 nm to about 10 nm; dielectric layer 110 may have a vertical thickness of about 10 nm to about 30 nm; dielectric layer 112 may have a vertical thickness of about 5 nm to about 10 nm; and dielectric layer 114 may have a vertical thickness of about 20 nm to about 50 nm.

One or more of the deposition processes illustratively described above can be utilized to deposit the multiple dielectric layers. Each of the various dielectric layers is selective to a particular etch process performed in forming the VTFET structure. As will be further explained below, the positions of the multiple dielectric layers are used to determine the positions of the upper and lower source/drains, the gate, other dielectrics and metal contacts in the VTFET structure.

Following the multilayer dielectric deposition, a vertical trench 115, having a high aspect ratio, is formed through all of the dielectric layers to the top surface of the substrate 102 as illustrated in FIG. 2, i.e., the etching process starts at the upper surface of dielectric layer 114 and ends at the upper surface of Si substrate 102. As mentioned above, the high aspect ratio trench feature is formed in accordance with the aspect ratio trapping (ART) technique. More particularly, a trench is formed made with a high aspect ratio (e.g., the ratio of the trench height/depth to trench width wherein the height/depth is much larger than the width) such that any defects in the material that subsequently fills the trench terminate on the sidewalls of the trench and any layer above the termination is defect free.

By way of example only, the vertical depth of trench 115 may be about 60 nm and a horizontal width of about 10 nm. It is to be understood that the trench depth depends on the cumulative thickness of the stacked dielectric layers 104 through 114 (i.e., since the trench 115 is formed from the top of dielectric layer 114, through the bottom of dielectric layer 104, to the top of substrate 102).

Figure 3:
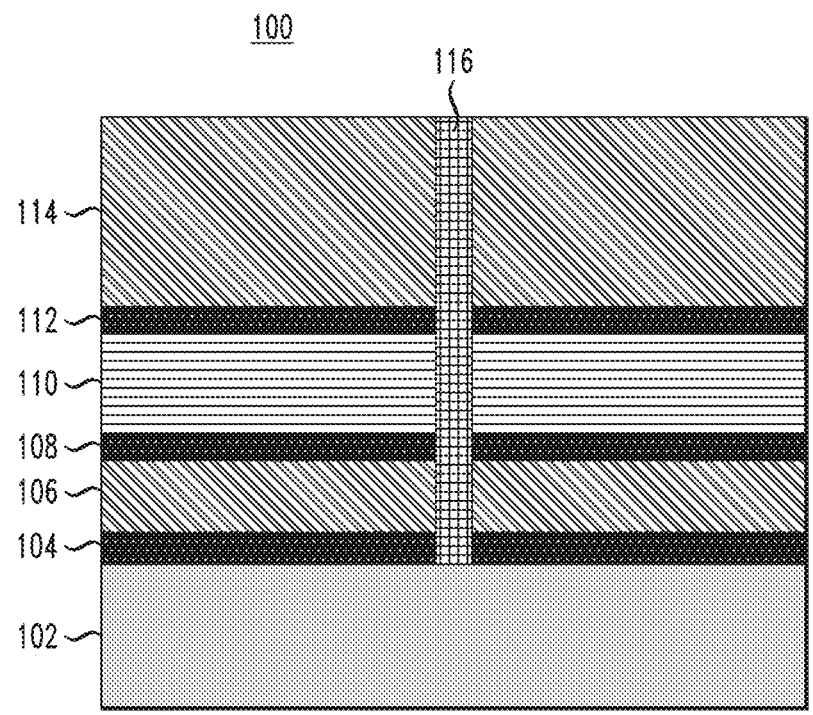
FIG. 3 depicts a side cross-sectional view of the semiconductor structure of FIG. 2 following aspect ratio trapping growth forming a vertical fin structure, according to an embodiment of the invention.

FIG. 3 depicts a side cross-sectional view of the semiconductor structure of FIG. 2 following ART growth forming a vertical fin structure 116, within vertical trench 115, according to an embodiment of the invention. In illustrative embodiments, the vertical fin structure 116 is composed of group III-IV semiconductor material. Performing the ART epitaxial growth or deposition forms a group III-V semiconductor vertical fin on the Si substrate 102. As mentioned above, such a structure that forms a fin structure with one lattice constant on a wafer (surface) with another lattice constant is referred to as a heterostructure. Different methods for epitaxially growing or depositing the III-IV fin material in the trench 115 may be employed. One non-limiting example is described in U.S. Pat. No. 9,349,809 issued on May 24, 2016, the disclosure of which is incorporated by reference in its entirety.

Figure 4:
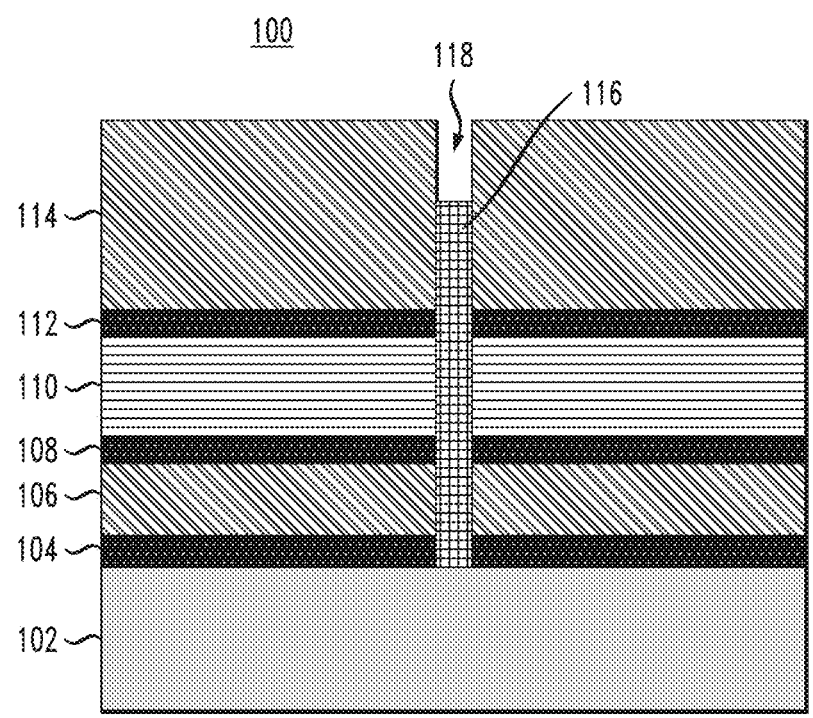
FIG. 4 depicts a side cross-sectional view of the semiconductor structure of FIG. 3 following recess of the fin structure, according to an embodiment of the invention.

FIG. 4 depicts a side cross-sectional view of the semiconductor structure of FIG. 3 following recess of the fin structure, according to an embodiment of the invention. The III-V fin structure 116 in trench 115 is partially recessed via an etching operation from its top surface to a position within the region of dielectric layer 114, leaving an opening 118 at the top of vertical trench 115. Note that the etching operation is selective to the $SiO_2$ material of dielectric layer 114. By way of example only, the etch chemistry may comprise phosphoric acid ($H_3PO_4$).

Figure 5:
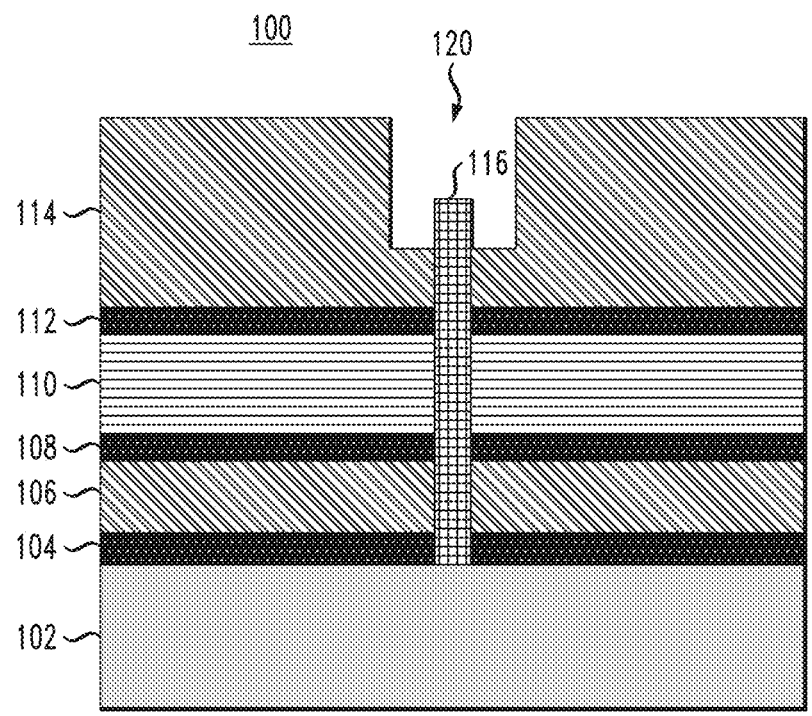
FIG. 5 depicts a side cross-sectional view of the semiconductor structure of FIG. 4 following isotropic etching of top dielectric layer, according to an embodiment of the invention.

FIG. 5 depicts a side cross-sectional view of the semiconductor structure of FIG. 4 following isotropic etching of top dielectric layer, according to an embodiment of the invention. More particularly, the isotropic etching of the dielectric layer 114 enlarges the opening 118 at the top of vertical trench 115 to form the larger opening 120 as illustrated in FIG. 5. Note that the isotropic etching operation uses a wet etchant that has a uniform etch rate in all directions and is selective to the group III-IV semiconductor material of fin structure 116. Thus, while the opening 120 still terminates within the region of dielectric layer 114, a portion of the fin structure 116 is exposed within the opening 120. By way of example only, the etch chemistry may comprise hydrogen fluoride (HF).

Figure 6:
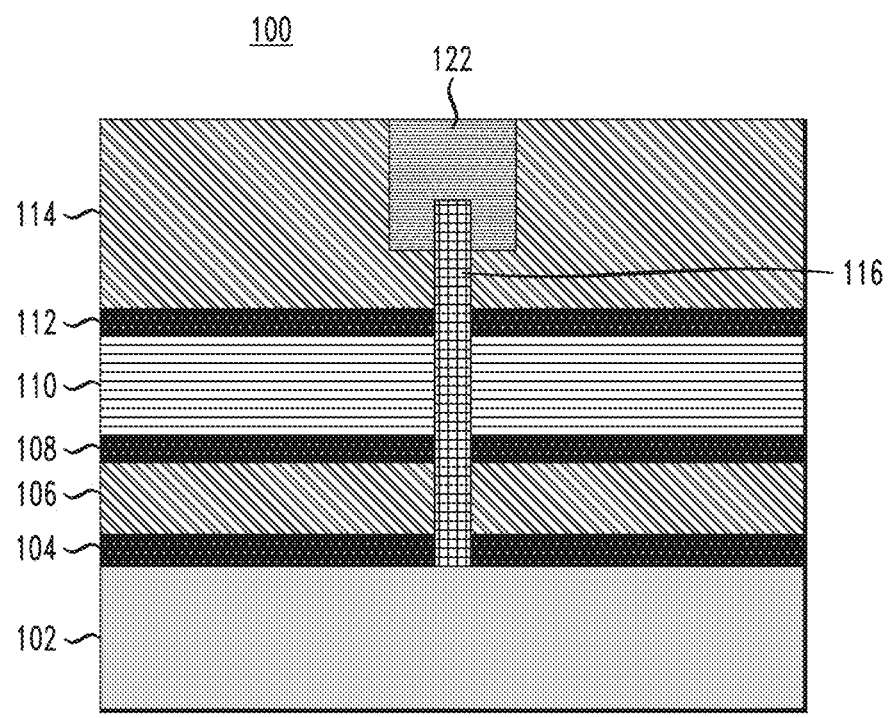
FIG. 6 depicts a side cross-sectional view of the semiconductor structure of FIG. 5 following hard mask deposition and planarization, according to an embodiment of the invention.

FIG. 6 depicts a side cross-sectional view of the semiconductor structure of FIG. 5 following hard mask deposition and planarization, according to an embodiment of the invention. More particularly, the opening 120 is filled with hard mask material, for example, SiN, using a conventional hard mask deposition operation to form hard mask 122. A chemical mechanical planarization (CMP) operation is then performed to planarize the top surface of hard mask 122 to be substantially coplanar with the top surface of dielectric layer 114.

Figure 7:
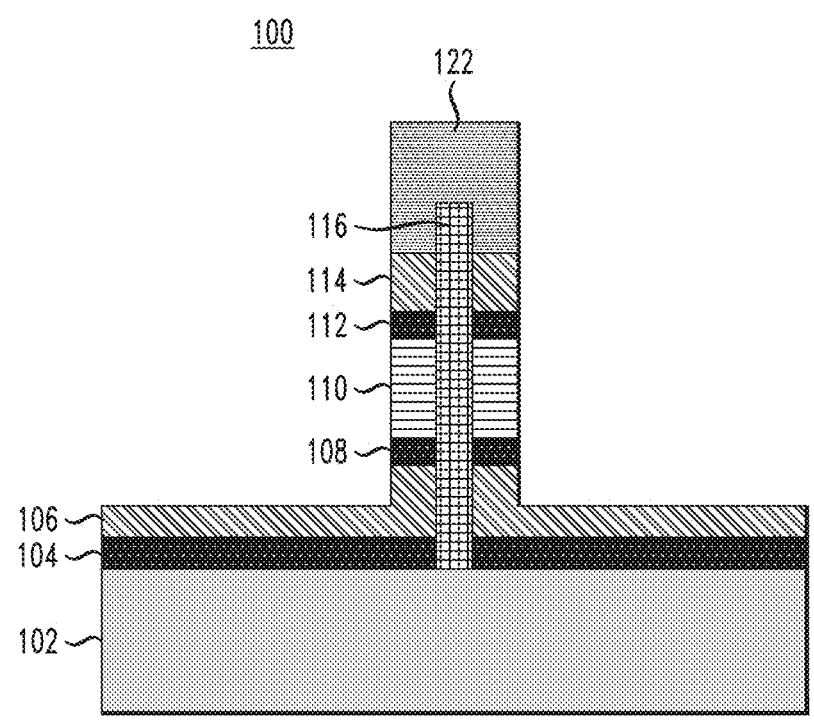
FIG. 7 depicts a side cross-sectional view of the semiconductor structure of FIG. 6 following directional etching, according to an embodiment of the invention.

FIG. 7 depicts a side cross-sectional view of the semiconductor structure of FIG. 6 following directional etching, according to an embodiment of the invention. More particularly, as shown in FIG. 7, a directional etch down operation is performed removing the dielectric layers 114, 112, 110, 108 not protected by hard mask 122, and partially removing portions of dielectric layer 106 not protected by hard mask 122. By way of example only, the etching process in this step may comprise a dry etch process such as reactive-ion etching (RIE).

Figure 8:
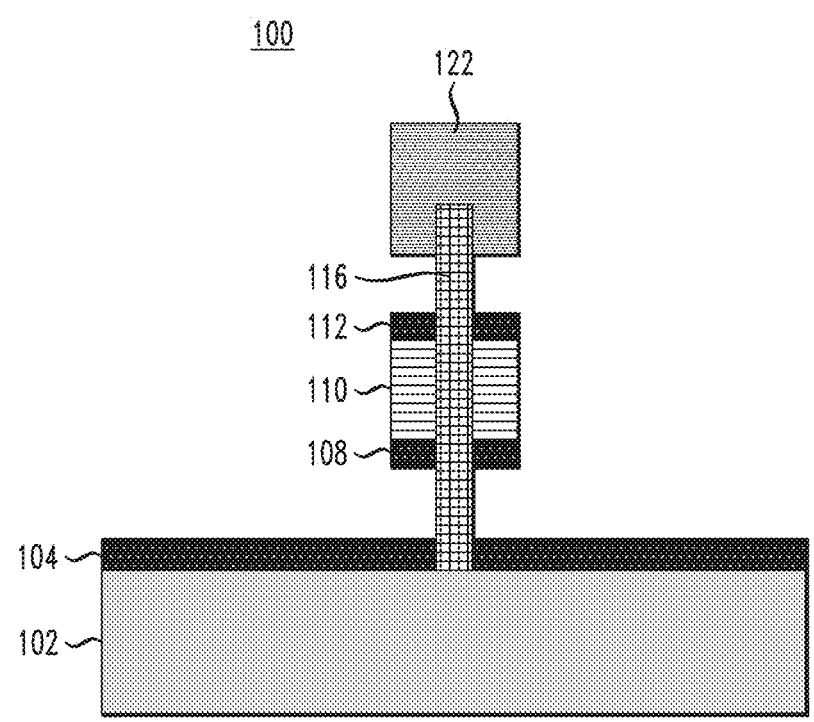
FIG. 8 depicts a side cross-sectional view of the semiconductor structure of FIG. 7 following removal of a given type of dielectric layer, according to an embodiment of the invention.

FIG. 8 depicts a side cross-sectional view of the semiconductor structure of FIG. 7 following removal of a given type of dielectric layer, according to an embodiment of the invention. More particularly, FIG. 8 illustrates a process in which the dielectric layers 106 and 114 are removed. The $SiO_2$ material of dielectric layers 106 and 114 are removed by performing an etching process that is selective to the other dielectric layers 104, 108, 110, 112, and to fin structure 116. By way of example only, the etch chemistry may comprise HF.

Figure 9:
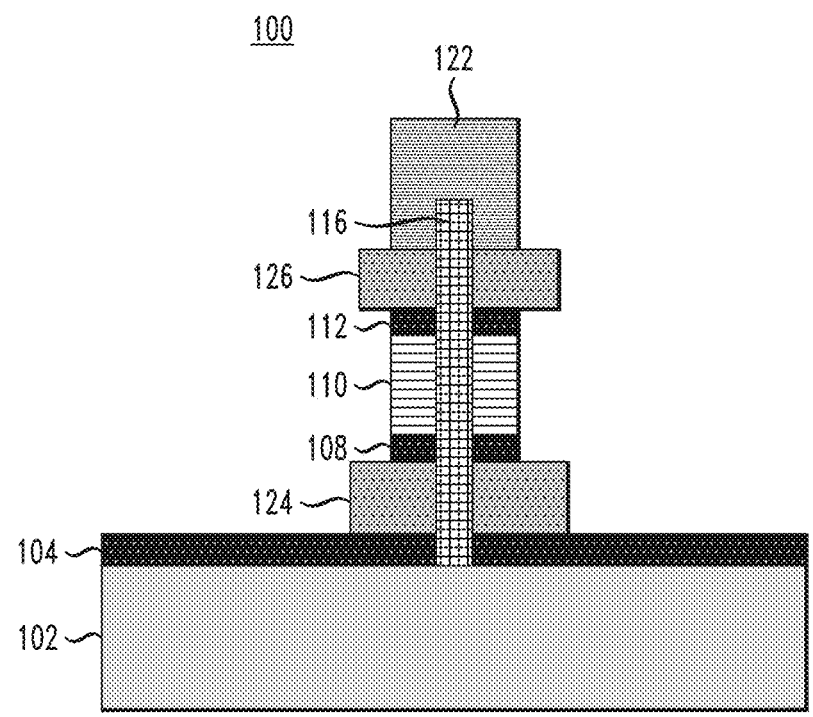
FIG. 9 depicts a side cross-sectional view of the semiconductor structure of FIG. 8 following growth of epitaxial layers for respective source/drain contacts, according to an embodiment of the invention.

FIG. 9 depicts a side cross-sectional view of the semiconductor structure of FIG. 8 following growth of epitaxial layers for respective source/drain contacts, according to an embodiment of the invention. More particularly, as illustrated in FIG. 9, respective epitaxial layers 124 and 126 corresponding to source/drain regions are formed in the regions of the $SiO_2$ material removed in the etching process of FIG. 8. Epitaxial layer 124 can form a source region while epitaxial layer 126 forms a drain region, or vice versa, depending on the type of FET structure being formed (e.g., p-type or n-type). In the case of both source/drain (S/D) regions, epitaxial growth is performed on the SiN dielectric materials of dielectric layers 104 and 112, respectively, and thus the lattice constants are substantially similar.

Figure 10:
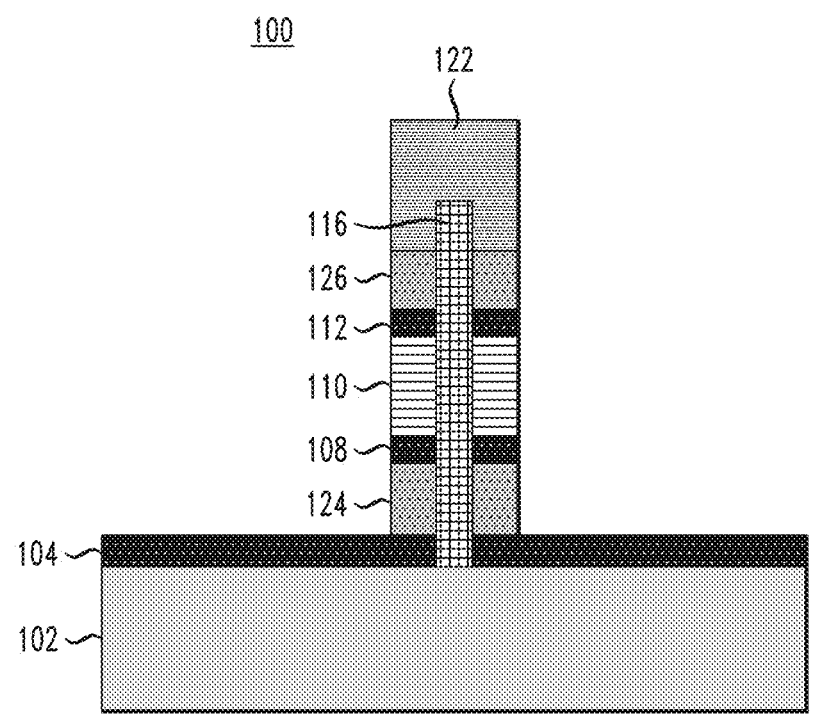
FIG. 10 depicts a side cross-sectional view of the semiconductor structure of FIG. 9 following self-aligned vertical etch of epitaxial layers, according to an embodiment of the invention.

FIG. 10 depicts a side cross-sectional view of the semiconductor structure of FIG. 9 following self-aligned vertical etch of epitaxial layers, according to an embodiment of the invention. More particularly, following the growth of the epitaxial layers as illustrated in FIG. 9, a self-aligned vertical etching operation is performed on the epitaxial layers 124 and 126. By way of example only, the etching process in this step may comprise directional RIE.

Figure 11:
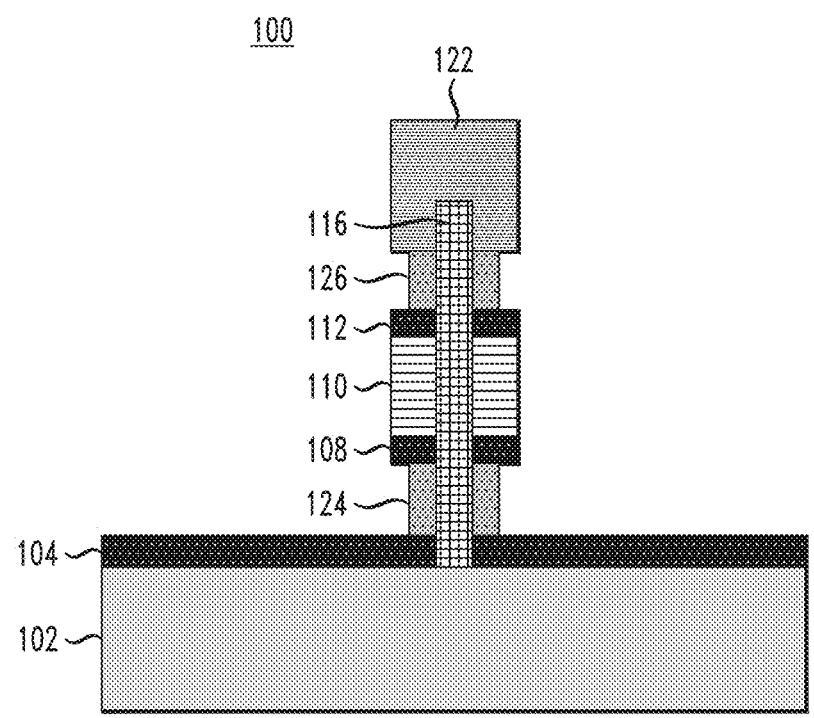
FIG. 11 depicts a side cross-sectional view of the semiconductor structure of FIG. 10 following lateral recessing of epitaxial layers, according to an embodiment of the invention.

FIG. 11 depicts a side cross-sectional view of the semiconductor structure of FIG. 10 following lateral recessing of epitaxial layers, according to an embodiment of the invention. As illustrated in FIG. 11, after the self-aligned vertical etch of the epitaxial layers 124 and 126, the epitaxial layers are laterally recessed using an anisotropic etching operation. By way of example only, the epitaxial layers 124 and 126 can be laterally recessed by about 6 nm to about 10 nm, and the etch chemistry may comprise ammonia.

Figure 12:
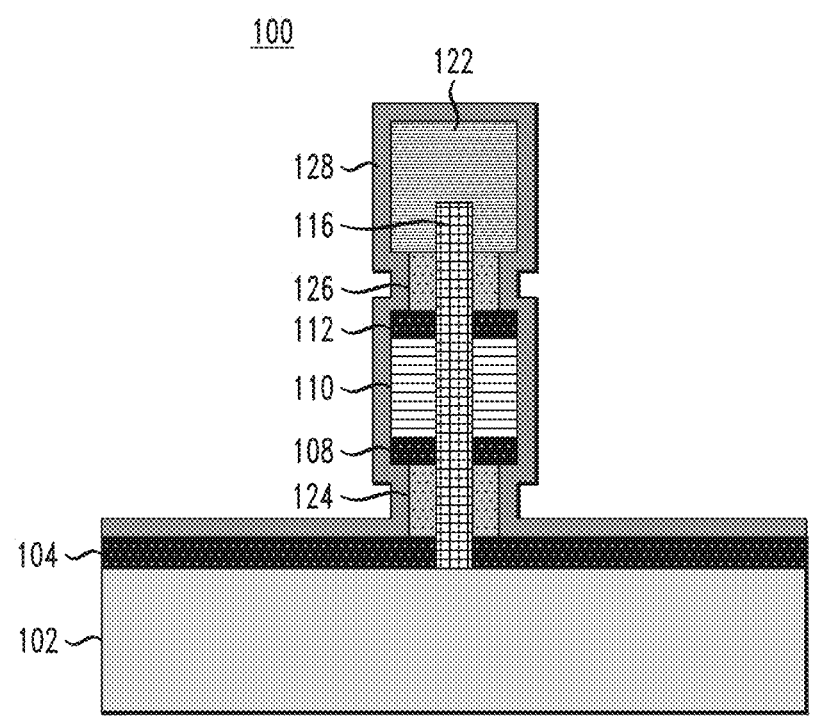
FIG. 12 depicts a side cross-sectional view of the semiconductor structure of FIG. 11 following isotropic deposition of dielectric liner, according to an embodiment of the invention.

FIG. 12 depicts a side cross-sectional view of the semiconductor structure of FIG. 11 following isotropic deposition of dielectric liner, according to an embodiment of the invention. More particularly, as shown, a dielectric liner 128 is isotropically deposited onto the structure 100. By way of example only, the dielectric liner 128 may have a thickness of about 6 nm to about 10 nm and may be composed of a silicon nitride (SiN) related material.

Figure 13:
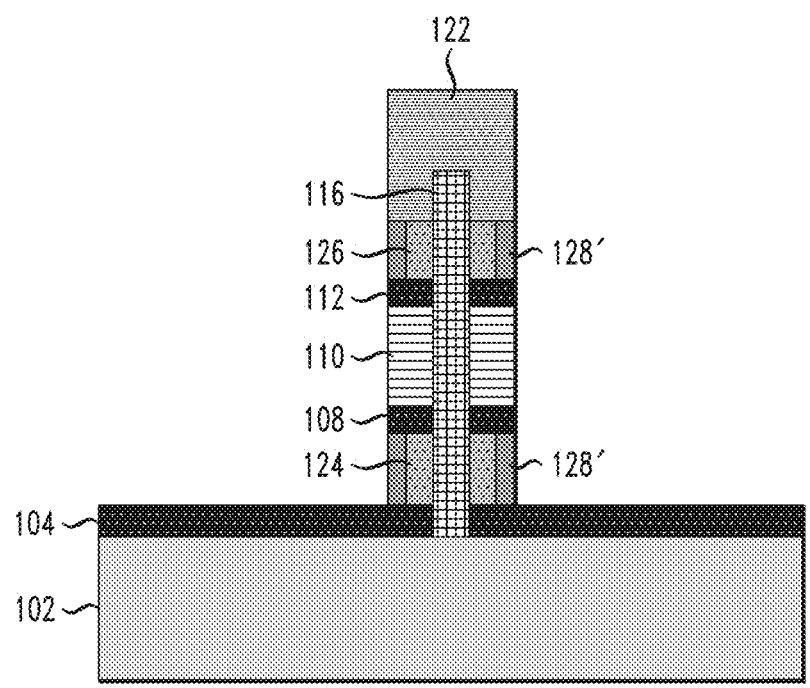
FIG. 13 depicts a side cross-sectional view of the semiconductor structure of FIG. 12 following directional etching of dielectric liner to seal epitaxial layers, according to an embodiment of the invention.

FIG. 13 depicts a side cross-sectional view of the semiconductor structure of FIG. 12 following directional etching of dielectric liner to seal epitaxial layers, according to an embodiment of the invention. More particularly, following the deposition of the dielectric liner 128, a directional etch (e.g., RIE) is performed to remove portions of the dielectric liner 128 not in direct contact with the epitaxial layers 124 and 126. The remaining portion 128' of dielectric liner 128 seals the S/D epitaxial layers 124 and 126 as illustrated in FIG. 13.

In the subsequent FIGS. 14A/B through 24A/B, it is to be appreciated that figures denoted with the reference letter B (i.e., FIGS. 14B, 15B, and so on) represent fin length cross sectional views of semiconductor structure 100, while figures denoted with the reference letter A (i.e., 14A, 15A, and so on) represent fin width cross sectional views of semiconductor structure 100 taken along line C-C. Note that line C-C is shown only in FIG. 14B for purpose of simplicity.

FIGS. 14A and 14B illustrate semiconductor structure 100 of FIG. 13 following self-aligned directional etching (e.g., RIE) forming a shallow trench 129 in dielectric layer 104 and substrate 102. By way of example only, the shallow trench 129 may have a depth of about 50 nm to about 100 nm.

FIGS. 15A and 15B depict respective width and length cross-sectional views of the semiconductor structure of FIGS. 14A and 14B following shallow isolation trench oxide fill, planarization and etching, according to an embodiment of the invention. More particularly, in the next step in the method of forming the VTFET, the shallow trench 129 shown in FIGS. 14A and 14B is filled with a shallow trench isolation (STI) oxide material 130 (e.g., $SiO_2$) to isolate the VTFET structure from adjacent structures and/or devices (not shown) formed on substrate 102 and thus prevent current leakage. The STI oxide deposition is followed by planarization, for example CMP, and then an etch back operation resulting in the structure 100 as illustrated in FIGS. 15A and 15B. By way of example only, etching may comprise RIE.

Figure 16B:
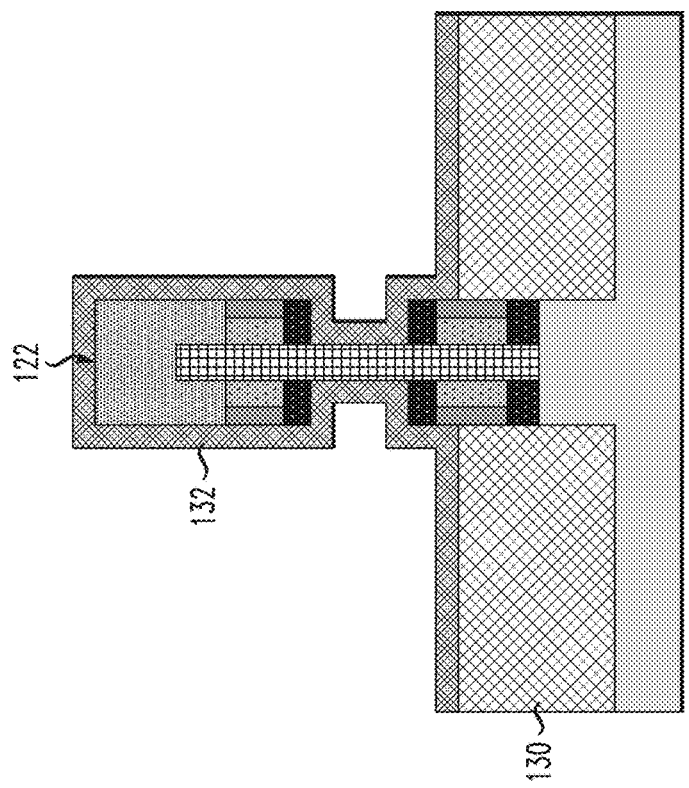
FIGS. 16A and 16B depict respective width and length cross-sectional views of the semiconductor structure of FIGS. 15A and 15B following selectively removal of a given type of dielectric layer and gate stack deposition, according to an embodiment of the invention.
Figure 16A:
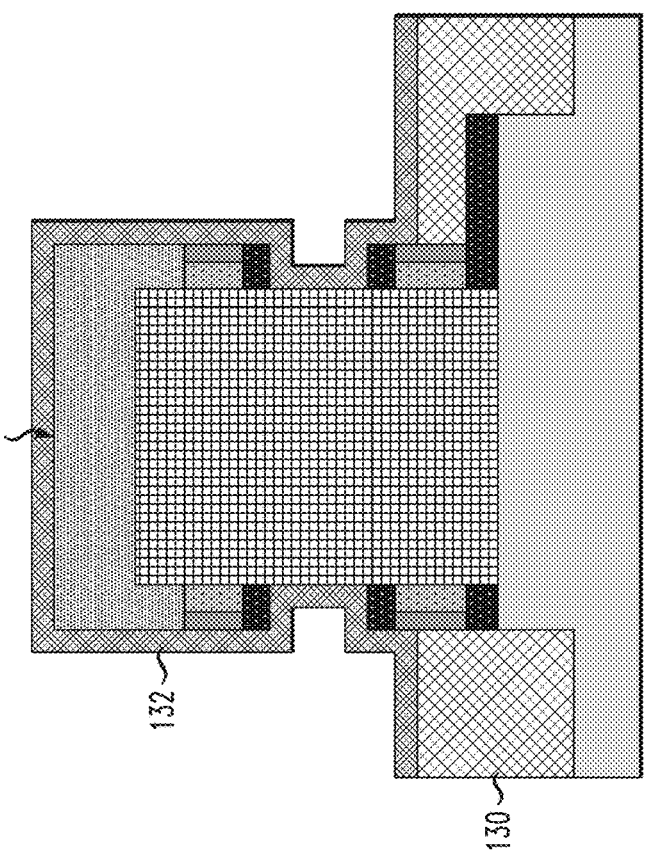

FIGS. 16A and 16B depict respective width and length cross-sectional views of the semiconductor structure of FIGS. 15A and 15B following selective removal of a given type of dielectric layer and gate stack deposition. In the current example, dielectric layer 110, which is SiCO, is removed using a wet etch process. Following the removal of the dielectric layer 110, a gate stack 132 is deposited over structure 100 as illustrated in FIGS. 16A and 16B. The gate stack 132 may comprise a high-k dielectric and work function metal.

Figure 17A:
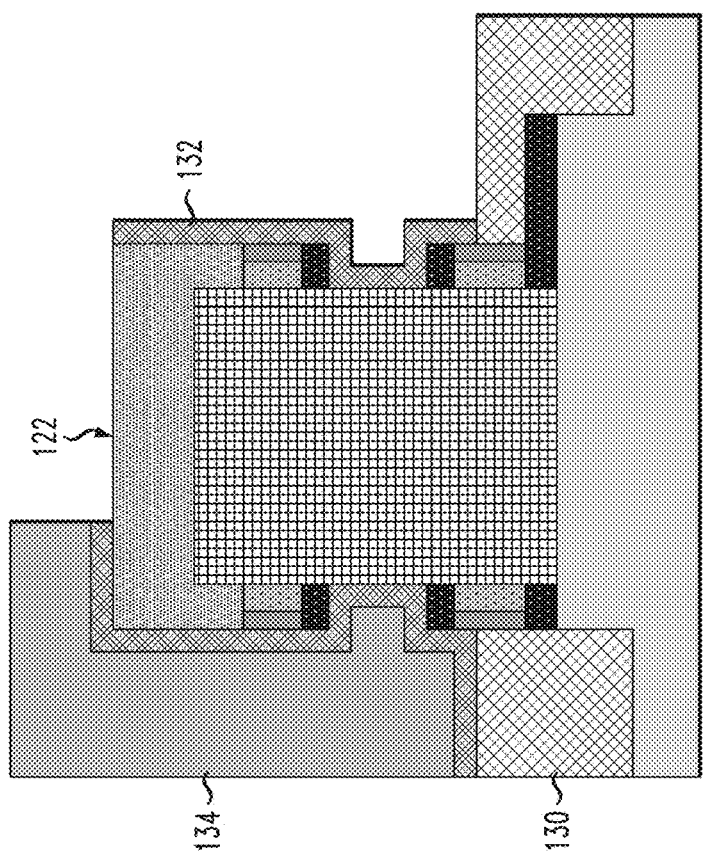
FIGS. 17A and 17B depict respective width and length cross-sectional views of the semiconductor structure of FIGS. 16A and 16B following gate patterning and organic planarization layer deposition, according to an embodiment of the invention.
Figure 17B:
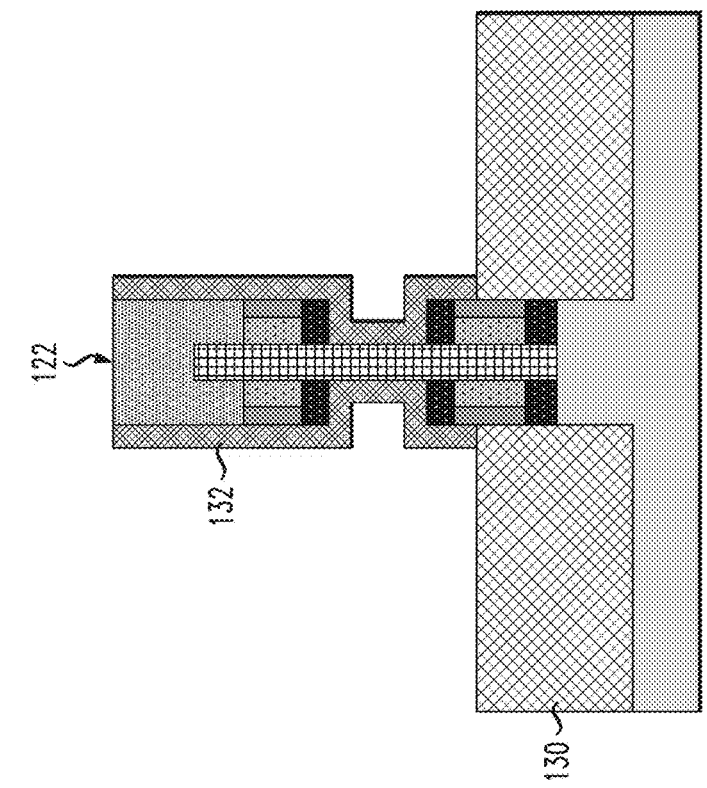

As illustrated in FIGS. 17A and 17B, the next step in the method of forming the VTFET is gate patterning. An organic planarization layer (OPL) 134 is deposited on the semiconductor structure 100 of FIGS. 16A and 16B in a method of patterning the gate. The gate stack 132 is then removed (e.g., directional RIE) from horizontal surfaces of STI 130 and hard mask 122 not protected by OPL 134.

Figure 18A:
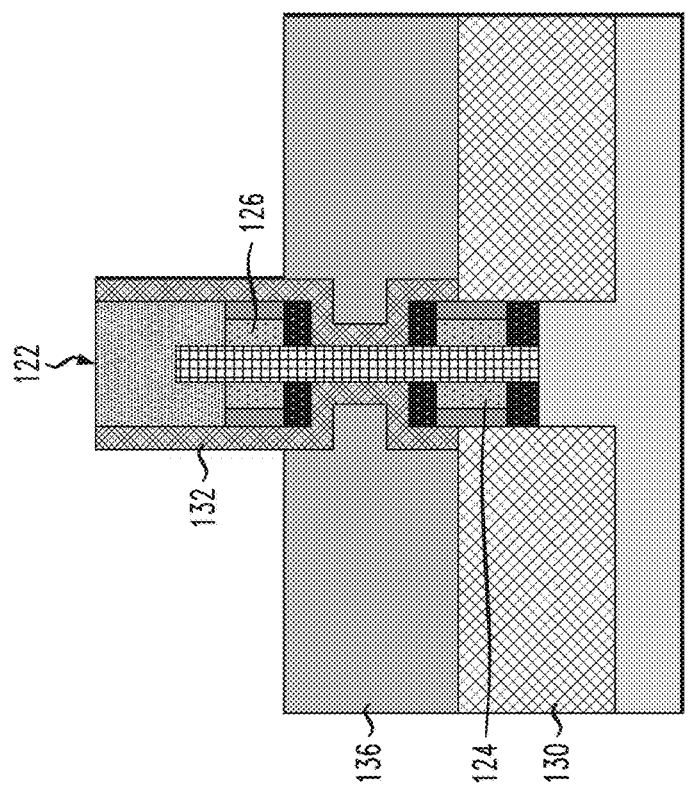
FIGS. 18A and 18B depict respective width and length cross-sectional views of the semiconductor structure of FIGS. 17A and 17B following organic planarization layer fill and recess, according to an embodiment of the invention.
Figure 18B:
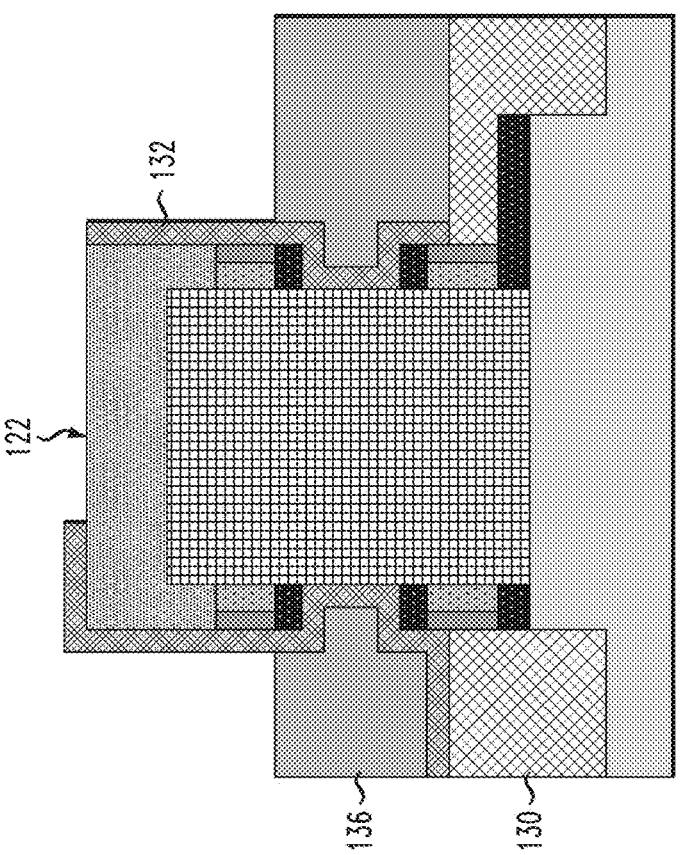

Following the removal of portions of the gate stack as illustrated in FIGS. 17A and 17B, an organic planarization layer (OPL) fill and recess is performed as illustrated in FIGS. 18A and 18B. OPL 136, formed above STI layer 130, has a thickness sufficient to cover the channel portion of the VTFET between the S/D regions 124 and 126.

Following the formation of OPL 136 illustrated in FIGS. 18A and 18B, the remaining gate stack 132 exposed above OPL 136 is removed as illustrated in FIGS. 19A and 19B. Removal of the exposed gate stack 132 may be accomplished by a wet etch process.

Figure 20B:
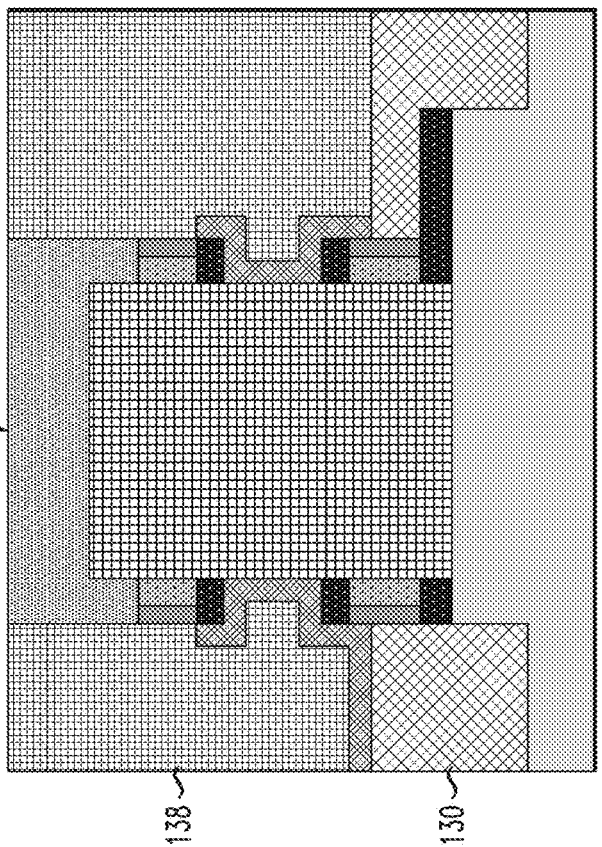
FIGS. 20A and 20B depict respective width and length cross-sectional views of the semiconductor structure of FIGS. 19A and 19B following interlayer dielectric fill and planarization, according to an embodiment of the invention.
Figure 20A:
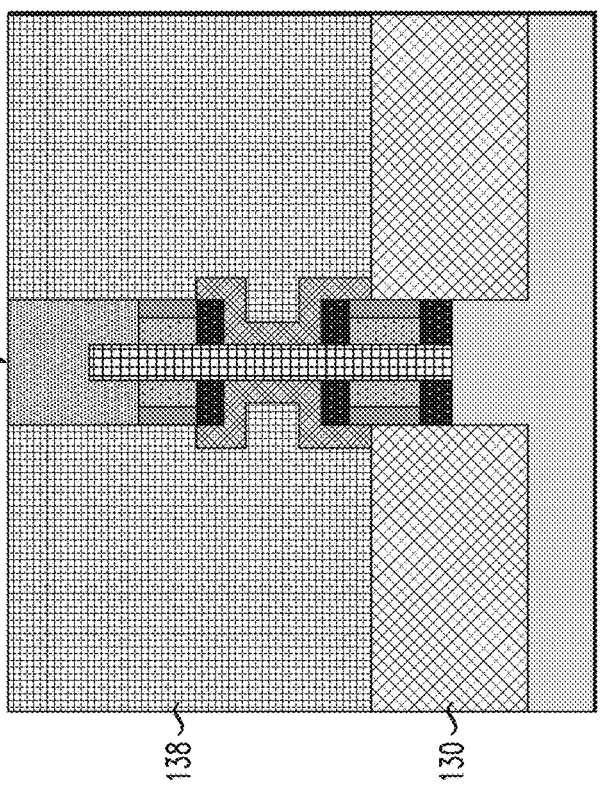

FIGS. 20A and 20B depict respective width and length cross-sectional views of semiconductor structure 100 of FIGS. 19A and 19B following an interlayer dielectric (ILD) fill 138 and subsequent planarization to the top surface of hard mask 122. The planarization may be achieved by, for example, CMP.

Figure 21B:
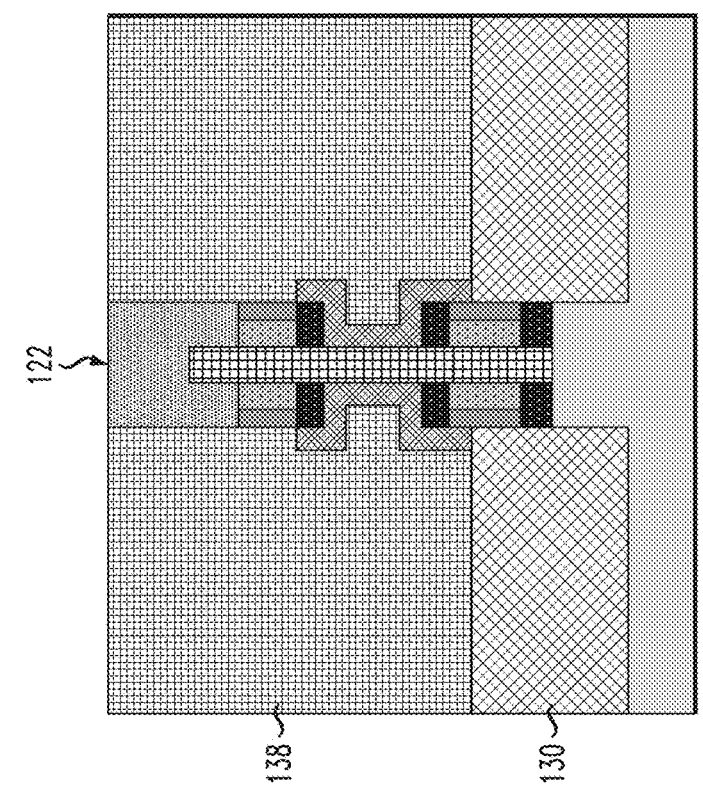
FIGS. 21A and 21B depict respective width and length cross-sectional views of the semiconductor structure of FIGS. 20A and 20B following formation of bottom source/drain contact opening, according to an embodiment of the invention.
Figure 21A:
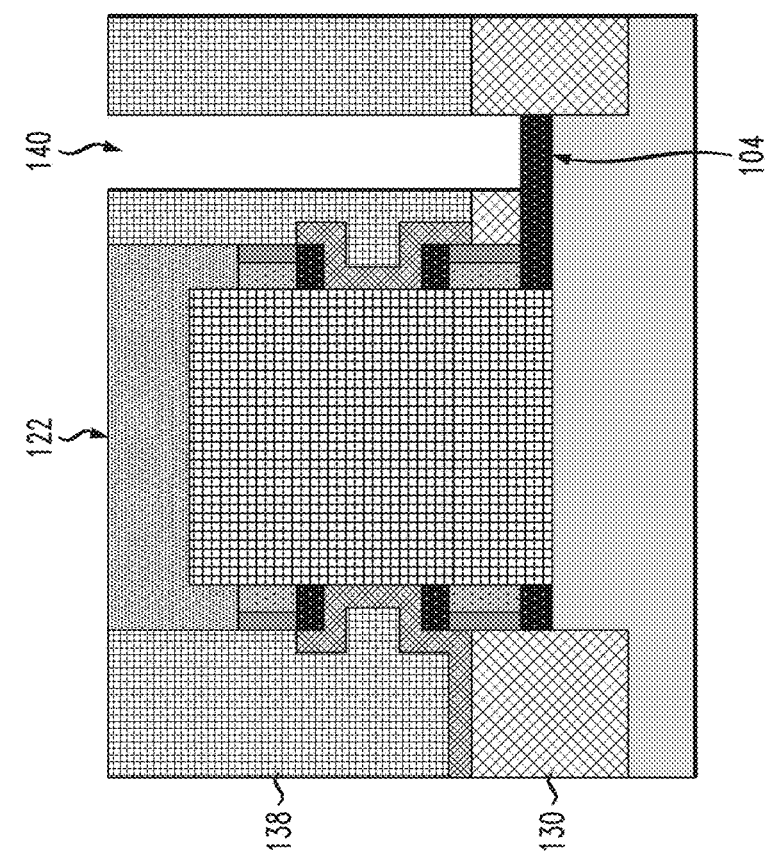

The remaining steps in the method of forming the VTFET are illustrated in FIGS. 21A and 21B through FIGS. 24A and 24B, in which the bottom and top S/D contacts and gate contact are formed. More particularly, FIGS. 21A and 21B depict respective width and length cross-sectional views of the semiconductor structure 100 of FIGS. 20A and 20B following the formation of the bottom source/drain contact opening 140. The contact opening 140 is formed through ILD 138 and through STI layer 130 until reaching the top surface of dielectric layer 104. The contact opening may be formed by standard lithography and RIE.

As illustrated in FIGS. 22A and 22B, the bottom dielectric layer 104 is selectively removed from the semiconductor structure 100 shown in FIGS. 21A and 21B such that a continuous gap is formed thru the contact opening 140 to the bottom surface of the bottom source/drain epitaxial layer 124. Removal of the bottom dielectric 104 can be achieved by a wet etch process using, for example, $H_3PO_4$.

Figure 23B:
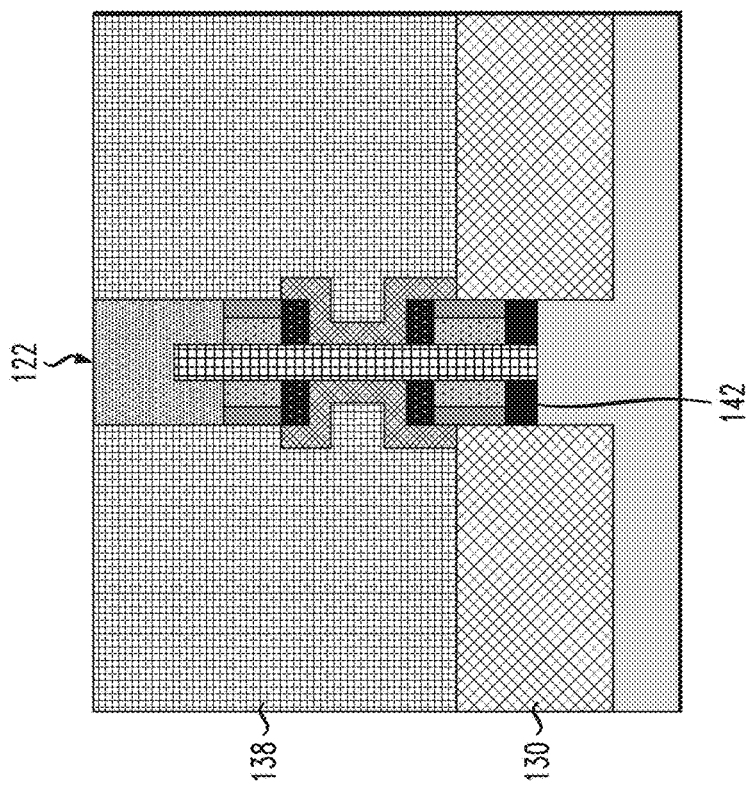
FIGS. 23A and 23B depict respective width and length cross-sectional views of the semiconductor structure of FIGS. 22A and 22B following bottom source/drain contact metal fill, according to an embodiment of the invention.
Figure 23A:
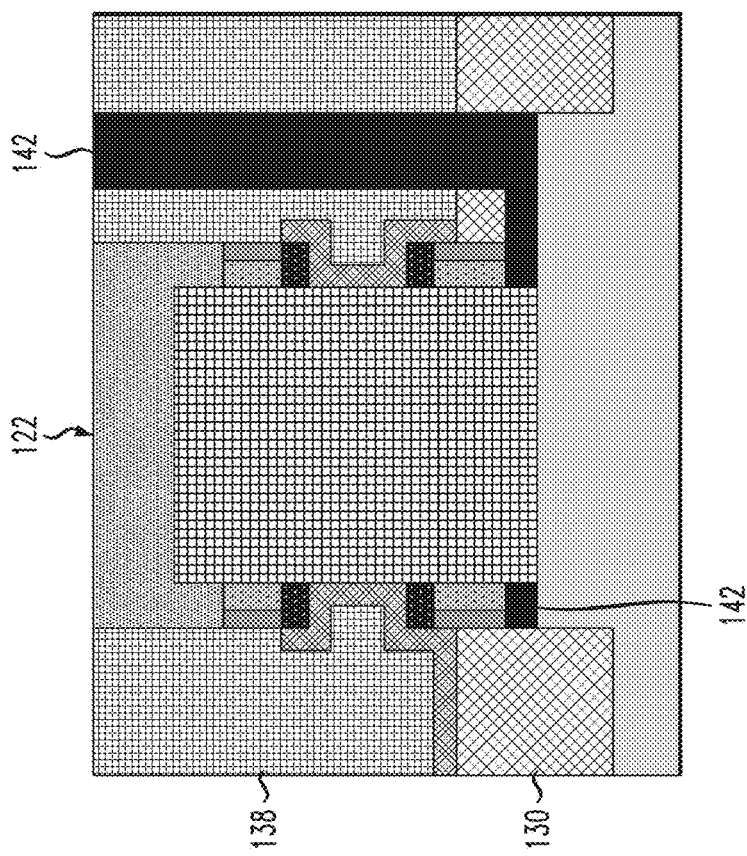
Figure 24B:
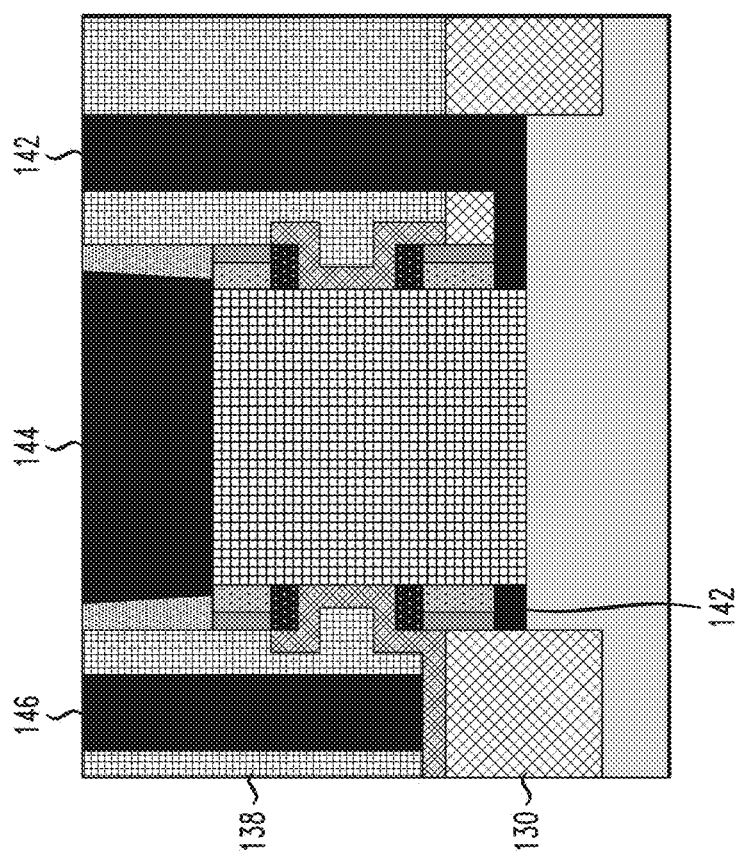
FIGS. 24A and 24B depict respective width and length cross-sectional views of the semiconductor structure of FIGS. 23A and 23B following respective top source/drain contact and gate contact formation and metal fill, according to an embodiment of the invention.
Figure 24A:
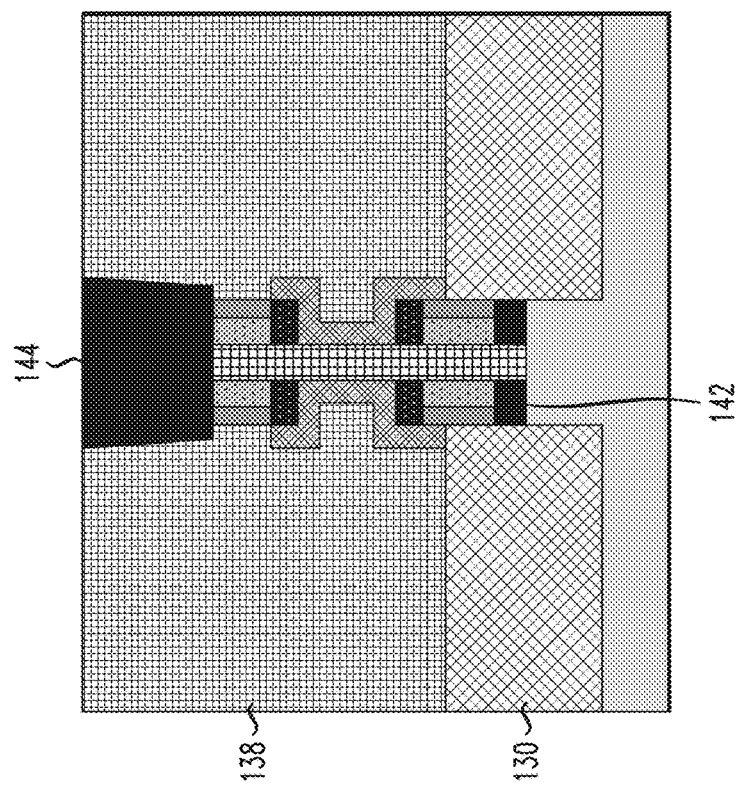

The bottom source/drain contact is then completed by filling the contact opening 140 and the space remaining from the removal of dielectric layer 104, as illustrated in FIGS. 22A and 22B, with a metal fill as illustrated in FIGS. 23A and 23B, thereby forming bottom source/drain contact 142.

FIGS. 24A and 24B illustrate the completed VTFET structure 200 after the formation of the top source/drain contact and the gate contact from the semiconductor structure 100 of FIGS. 23A and 23B. Forming the gate contact comprises first forming a contact opening in ILD 138 to expose a surface of gate stack 132, followed by a metal fill to form gate contact 146. In forming the top source/drain contact 144, an opening in hard mask 122 is formed exposing the top surface of top source/drain epitaxial layer 126 followed by a metal fill. By way of example only, gate contact and source/drain contacts can comprise titanium (Ti), titanium nitride (TiN), or tungsten (W).

It is to be understood that the various layers and/or regions shown in the accompanying drawings are drawn to scale, and that one or more layers and/or regions of a type commonly used in, for example, FET structures and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

As used herein, "height" illustratively refers to a vertical size of an element (e.g., a layer, trench, hole, opening, etc.) in the cross-sectional views measured from a bottom surface to a top surface of the element, and/or measured with respect to a surface on which the element is located. Conversely, a "depth" illustratively refers to a vertical size of an element (e.g., a layer, trench, hole, opening, etc.) in the cross-sectional views measured from a top surface to a bottom surface of the element.

As used herein, "lateral," "lateral side," "lateral surface" illustratively refer to a side surface of an element (e.g., a layer, opening, etc.), such as a left or right-side surface in the drawings.

As used herein, "width" or "length" illustratively refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall illustratively relate to the disclosed structures and methods, as oriented in the drawing figures. For example, as used herein, "vertical" illustratively refers to a direction perpendicular to the top surface of the substrate in the cross-sectional views, and "horizontal" illustratively refers to a direction parallel to the top surface of the substrate in the cross-sectional views.

As illustratively used herein, unless otherwise specified, terms such as "on", "overlying", "atop", "on top", "positioned on" or "positioned atop" mean that a first element is present on a second element, wherein intervening elements may be present between the first element and the second element. As illustratively used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Furthermore, various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be appreciated and should be understood that the exemplary embodiments of the invention described above can be implemented in a number of different fashions. Given the teachings of the invention provided herein, one of ordinary skill in the related art will be able to contemplate other implementations of the invention. Although illustrative embodiments of the present invention have been described herein with reference to the accompanying drawings, it is to be understood that the invention is not limited to those precise embodiments, and that various other changes and modifications may be made by one skilled in art without departing from the scope or spirit of the invention.

What is claimed is:

1. A semiconductor structure, comprising:
a silicon substrate;
a non-silicon vertical fin structure formed on the silicon substrate using an aspect ratio trapping process;
a gate stack, a first source/drain region, and a second source/drain region disposed at defined locations by a plurality of dielectric layers formed on the silicon substrate and selectively removed; and
metal contacts to electrically couple respectively with the gate stack, the first source/drain region, and the second source/drain region,
wherein the plurality of dielectric layers comprises a first dielectric layer formed on the silicon substrate, a second dielectric layer formed on the first dielectric layer, a third dielectric layer formed on the second dielectric layer, a fourth dielectric layer formed on the third dielectric layer, a fifth dielectric layer formed on the fourth dielectric layer, and a sixth dielectric layer formed on the fifth dielectric layer,
wherein the first, third, and fifth dielectric layers comprise silicon nitride, the second and sixth dielectric layers comprise silicon dioxide, and the fourth dielectric layer comprises carbon doped silicon oxide.

2. The semiconductor structure of claim 1, wherein the first dielectric layer has a vertical thickness of about 10 nanometers (nm) to about 20 nm.

3. The semiconductor structure of claim 1, wherein the vertical fin structure is epitaxially grown with a non-silicon material.

4. The semiconductor structure of claim 3, wherein the non-silicon material comprises group III-IV semiconductor material.

5. The semiconductor structure of claim 1, wherein the vertical fin structure is a recessed vertical fin structure to a given depth within the sixth dielectric layer.

6. The semiconductor structure of claim 1, further comprising the first source/drain region and the second source/drain region respectively within the regions of removed second and sixth dielectric layers.

7. The semiconductor structure of claim 6, further comprising a dielectric liner disposed over the semiconductor structure.

8. The semiconductor structure of claim 7, wherein the dielectric liner has a thickness of about 6 nm to about 10 nm.

9. A vertical transport field-effect transistor, comprising:
one or more semiconductor structures, wherein at least one of the semiconductor structures comprises:
a silicon substrate;
a non-silicon vertical fin structure formed on the silicon substrate using an aspect ratio trapping process;
a gate stack, a first source/drain region, and a second source/drain region formed at defined locations by a plurality of dielectric layers formed on the silicon substrate and selectively removed; and
metal contacts to electrically couple respectively with the gate stack, the first source/drain region, and the second source/drain region,
wherein the plurality of dielectric layers comprises a first dielectric layer formed on the silicon substrate, a second dielectric layer formed on the first dielectric layer, a third dielectric layer formed on the second dielectric layer, a fourth dielectric layer formed on the third dielectric layer, a fifth dielectric layer formed on the fourth dielectric layer, and a sixth dielectric layer formed on the fifth dielectric layer,
wherein the first, third, and fifth dielectric layers comprise silicon nitride, the second and sixth dielectric layers comprise silicon dioxide, and the fourth dielectric layer comprises carbon doped silicon oxide.

10. The vertical transport field-effect transistor of claim 9, wherein the first dielectric layer has a vertical thickness of about 10 nanometers (nm) to about 20 nm.

11. The vertical transport field-effect transistor of claim 9, wherein the vertical fin structure is epitaxially grown with non-silicon material.

12. The vertical transport field-effect transistor of claim 11, wherein the non-silicon material comprises group III-IV semiconductor material.

13. The vertical transport field-effect transistor of claim 9, wherein the vertical fin structure is a recessed vertical fin structure to a given depth within the sixth dielectric layer.

14. The vertical transport field-effect transistor of claim 9, further comprising the first source/drain region and the second source/drain region respectively within the regions of removed second and sixth dielectric layers.

15. The vertical transport field-effect transistor of claim 14, further comprising a dielectric liner disposed over the semiconductor structure.

16. The vertical transport field-effect transistor of claim 15, wherein the dielectric liner has a thickness of about 6 nm to about 10 nm.

17. The semiconductor structure of claim 1, wherein the second dielectric layer has a vertical thickness of about 15 nm to about 30 nm.

18. The semiconductor structure of claim 1, wherein the third dielectric layer has a vertical thickness of about 5 nm to about 10 nm.

19. The vertical transport field-effect transistor of claim 9, wherein the second dielectric layer has a vertical thickness of about 15 nm to about 30 nm.

20. The vertical transport field-effect transistor of claim 9, wherein the third dielectric layer has a vertical thickness of about 5 nm to about 10 nm.

\* \* \* \* \*